LOW-FREQUENCY POWER AMPLIFIER

Filed Nov. 2, 1948 2 Sheets-Sheet 1

Inventor
LOUIS L. POURCIAU
RAYMOND L. GARMAN

By

H. L. Mackey

Attorney

Nov. 7, 1950 L. L. POURCIAU ET AL 2,529,459

LOW-FREQUENCY POWER AMPLIFIER

Filed Nov. 2, 1948 2 Sheets-Sheet 2

Inventor

LOUIS L. POURCIAU

RAYMOND L. GARMAN

By

H. L. Mackay

Attorney

Patented Nov. 7, 1950

2,529,459

UNITED STATES PATENT OFFICE 2,529,459

LOW-FREQUENCY POWER AMPLIFIER

Louis L. Pourciau and Raymond L. Garman, Pleasantville, N. Y., assignors to General Precision Laboratory, Incorporated, a corporation of New York Application November 2, 1948, Serial No. 57,866

6 Claims. (Cl. 179—171)

This invention relates to a low frequency power amplifier particularly adapted for use in commercial installations such as theatres, public address systems and the like where high fidelity of reproduction and relative high outputs are particularly to be desired.

The high quality of performance demanded of amplifiers used in such installations requires that they have low distortion and a low noise level. A purpose of the present invention, therefore, is the provision of an amplifier having such characteristics and at the same time one of relatively simple and economical construction.

With this purpose in view, one feature of the instant invention resides in the use of negative feedback circuits to provide low distortion and low noise level.

The output of an amplifier consists of the amplified signal and in addition a smaller amount of unwanted noise and distortion. When a portion of the output of the amplifier is returned to the input thereof in the proper phase relative to the impressed signal, the amplified signal so returned may be made to cancel noise and distortion to a large extent. As is well known in the art, such circuits are known as negative feedback circuits and while they tend to reduce the signal output level to some extent, the advantages gained by their use greatly outweigh any losses thus entailed. Particularly so in the instant invention where by careful design the gain is made to be such as to produce a desired output level despite the losses inherent in the use of negative feedback circuits.

Negative feedback circuits may be either of two types, i. e., voltage feedback or current feedback, and both act to reduce distortion and noise and to increase the stability of the amplifier roughly in proportion to the amount of signal energy so fed back. Voltage feedback decreases the amplifier internal impedance while current feedback increases such internal impedance.

If the amplifier is to be matched to the load to which it is connected, as it must be for proper operation, there is a limit to the amount of voltage feedback which may be used which may be less than is desired for the required reduction of distortion and noise. In the present invention this difficulty is overcome by the use of two feedback circuits, one a negative voltage feedback and the other a negative current feedback. These feedbacks, one tending to decrease the internal impedance and the other tending to increase it may be so proportioned that the proper load match is maintained and at the same time greater feedback with its consequent greater amplifier stability and greater reduction in distortion and noise is obtained than could be attained by the use of either feedback separately.

Additionally the use of a current feedback circuit greatly improves operation when it is desired to operate a pair of amplifiers in parallel connected to a common load. It is of particular advantage in theatre sound systems to provide a small number of basic amplifiers having particular output ratings and to utilize such amplifiers in parallel in such installations as may require larger amounts of power output. By this means production may be limited to a smaller number of standard items with the attendant reduction in costs. If amplifiers are to be operated in parallel, however, it is essential that each contribute a nearly equal amount of current, otherwise the advantages gained by the use of such an arrangement are lost.

Different amplifiers, no matter how carefully constructed will differ in gain and internal impedance due to the different characteristics of tubes, etc., and these factors affect the equal sharing of the load. When current feedback is used, however, each amplifier has the characteristics of a current generator which results in a stabilization of their operation in parallel.

As an additional aid in reducing distortion in the amplifier of the instant invention, while at the same time providing high output levels with a limited number of components a so-called cathode follower drive is used for the final push-pull stage of amplification.

Power tubes of various types produce relatively large power outputs but such tubes require low impedance inputs for proper operation, that is, operation at low distortion. In the present invention the high impedance output of earlier resistance coupled stages is transformed to the necessary low impedance input for the power tubes of the final stage by the use of cathode follower coupling.

Concomitant with the advantage of producing the required low impedance input for the power tubes, the use of the cathode follower drive as it is incorporated in the present invention has the advantage of reducing distortion at peak signals. In the amplifier of this invention the control electrodes of the power amplifier stage are connected by direct metallic connections to the cathodes of a pair of cathode followers and no coupling condensers are used so that only a pure resistance network is connected to the input of the power amplifier stage.

In the various applications for which the present invention is particularly adapted, sharp increases in signal strength or peak signals are frequently experienced which drive the control electrodes of the power amplifier stage so far positive as to result in a flow of grid current. This will, of course, result in a flattening of such peak signals. At the same time if coupling condensers were employed, as has heretofore been usual in the art, a high charge would be acquired by these condensers as a result of such grid current flow and this charge which is dissipated relatively slowly through the coupling resistors effectively raises the cutoff level of the power amplifiers for a period of time. Under such circumstances signals of less than peak strength are likewise flattened and distorted on their negative swing. By avoiding the use of such elements in the circuit of the present amplifier the disadvantages attendant on their use are likewise avoided.

A still further purpose of the present invention resides in the provision of an amplifier in which the variations in characteristics of the components used do not in and of themselves introduce distortion. In a well designed and well constructed amplifier the only elements which require replacement from time to time are the various thermionic tubes. These devices while carefully constructed and designed, nevertheless have characteristics which vary within certain limits of tolerance and the gains of various tubes of the same type are often found to be somewhat different.

To accomplish the purpose of obtaining high fidelity of response and relatively high power which at the same time using relatively few components, this invention utilizes resistance-capacity coupling with a push-pull output. In such a system it is found to be the most practical to convert a single-sided input to a push-pull output through the use of a phase inverting tube whose input is derived from the output of the single-sided first stage and whose output is of opposite phase to the input of the first stage. Thus the output of the first stage and the inverter stage constitute the push-pull input for the next succeeding stage.

However, for proper balance of the outputs of the first stage and the inverter stage, the outputs of these stages must be equal and opposite. This balance might be obtained in the first instance by a proper adjustment of circuit values in relation to the tube characteristics but on replacement of either or both of such tubes the initial carefully designed balance may be destroyed and distortional effects introduced.

In this invention a special circuit is provided so that regardless of variations in tube characteristics the outputs of the amplifier and phase inverter are always balanced and the replacement of the original tubes with others of slightly different characteristics does not adversely affect such balance. To this end the outputs of the amplifier and the phase inverter are caused to oppose each other in a resistance network in such a fashion that the signal applied to the input of the phase inverter varies as the ratio of the gain of the amplifier and the phase inverter. Thus if the relative gains of the amplifier and phase inverter are different or vary for any reason so that there is a tendency to produce unbalanced outputs, the signal impressed on the input of the phase inverter is reduced or increased in accordance with the changed ratio of gains and balance is thereby restored to the system.

It will be apparent, therefore, that this invention has for its essential purpose the provision of a unitary standard amplifier unit which while using as few components as possible nevertheless satisfies high standards of performance, namely, an amplifier having a large output with very little noise and distortion. To this end the various circuit arrangements referred to briefly above, have been combined so that they coact with each other to achieve these highly desirable results.

The exact nature of the invention will be more clearly understood by reference to the following detailed description taken together with the drawings, in which.

Figure 1:
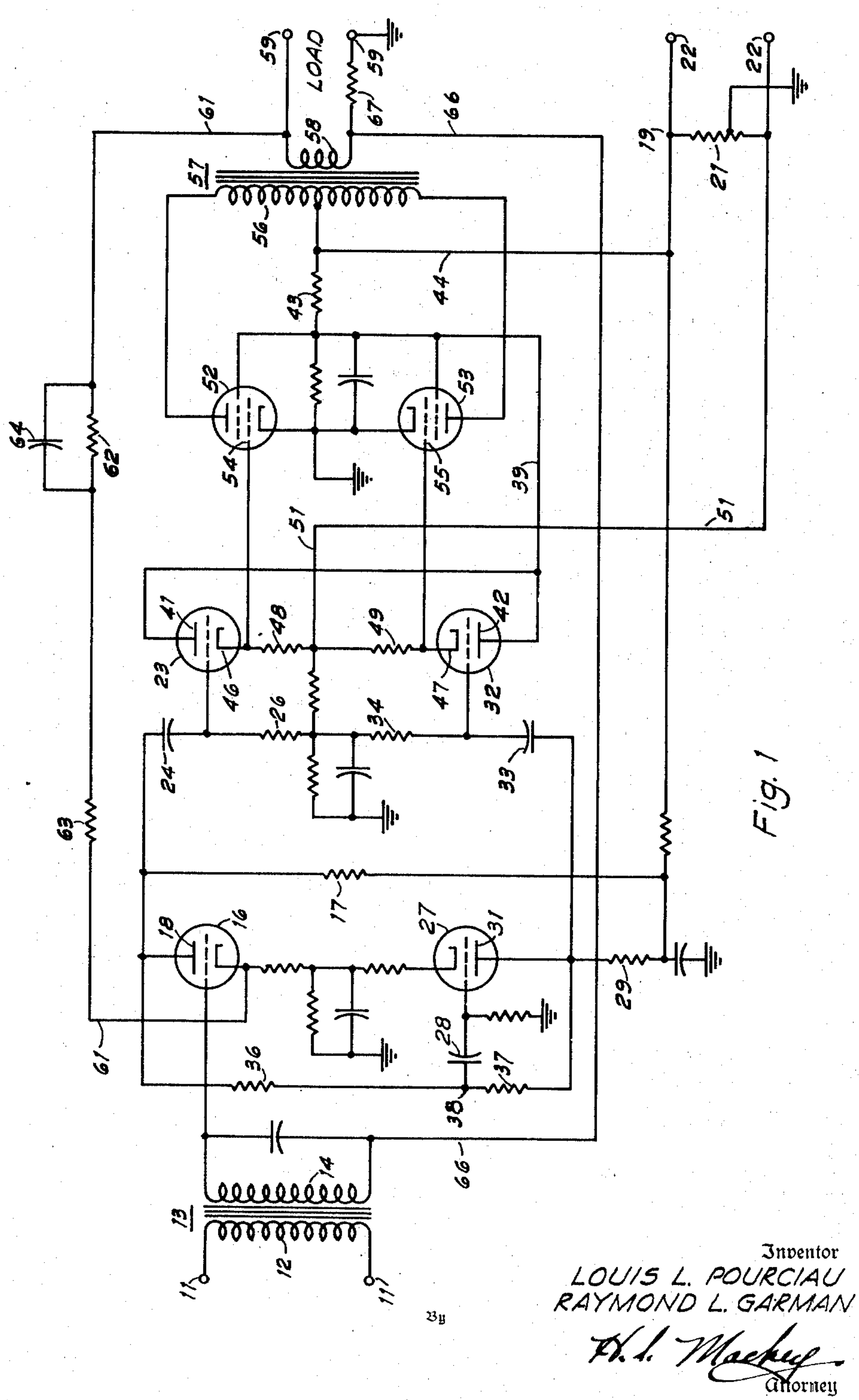
Figure 1 is a schematic diagram of one amplifier circuit embodying the invention.

Referring now to Fig. 1 the signal to be amplified, which in theatre systems may be derived from the output of a suitable preamplifier or from any other suitable signal source depending on the use to which the instant invention is put, is impressed on the terminals 11, 11 connected to the primary 12 of a suitable transformer 13. The secondary 14 of the transformer 13 is connected to the input of the first amplifier tube 16 and the signal so imposed on this tube is amplified thereby in the usual manner producing an amplified signal potential across the resistor 17 connected between the anode 18 and the positive terminal 19 of a potential supply source indicated diagrammatically by the grounded divider 21 and terminals 22, 22.

A portion of this amplified signal potential is impressed on the input of a coupling tube 23 through the medium of a coupling condenser 24 and resistance 26. Additionally a second portion of the amplified signal potential produced across resistor 17 is impressed on the input of a phase inverter tube 27 through a coupling condenser 28.

The phase inverter tube 27 amplifies and inverts the phase of the signal impressed on its input and this amplified and inverted signal appears as an amplified signal potential across the resistor 29 connected between the anode 31 and the positive terminal 19 of the potential supply source. This amplified output is in turn impressed on the input of the coupling tube 32 through a coupling condenser 33 and resistor 34.

Tubes 23 and 32 thus constitute a push-pull coupling circuit, the tube 23 receiving signals of one phase from the output of the amplifier 16 and the tube 32 receiving signals of the opposite phase from the output of the phase inverter 27.

In order that balance be maintained, that is, that the signal outputs of the amplifier 16 and phase inverter 26 be equal although opposite in phase regardless of variation in the characteristics of these tubes the outputs thereof are connected to oppose each other in a circuit consisting of a pair of resistors 36 and 37 connected in series between the anode 18 and the anode 31. The signal input for the phase inverter is derived through the coupling condenser 28 connected to the ungrounded juncture 38 of resistors 36 and 37 so that the amplitude of the signal impressed on the input of the phase inverter 27 is the potential of the juncture 38 whatever that may be.

This circuit operates to insure that the outputs of the amplifier 16 and phase inverter 27 shall be of equal magnitude although of opposite phase regardless of any relative difference in tube characteristics in the following manner.

Assume first, for the purposes of explanation that the phase inverter 27 be ignored. Under such conditions when a signal is impressed on the input of the amplifier 16 a signal potential will be produced across the output resistor 17 which is the product of the signal input and the gain of the amplifier 16, and the juncture 38 of resistors 36 and 37 will be brought to a potential equal thereto. However, considering now the phase inverter 27, it is apparent that the potential assumed by the juncture 38 constitutes the input for this tube and the phase inverter will develop a potential across its output resistor 29 which in turn is equal to the product of its input signal and the gain of the tube.

This potential is opposed to the output potential developed by the amplifier 16 across its output resistor 17 by reason of the series connection of resistors 36 and 37 between the two output circuits. The potential of the juncture 38, therefore, is caused to approach a potential which is the difference of the potentials developed across resistors 17 and 29, that is, the difference of the signal outputs of the amplifier 16 and phase inverter 27. If the resistors 36 and 37 are exactly equal the ratio of the signal amplitude impressed on the input of the phase inverter 27 and the signal amplitude impressed on the input of the amplifier 16 is very nearly equal to the inverse ratio of the gains of these tubes. Specifically this relationship may be expressed by the following approximate formula:

$$\frac{e_i}{e_a}=\frac{G_a}{G_i+1}$$

where $e_i$ is the amplitude of the signal impressed on the input of the phase inverter, $e_a$ the amplitude of the signal impressed on the input of the amplifier, $G_a$ the gain of the amplifier and $G_i$ is the gain of the phase inverter.

Where, as the instant invention the gains of the tubes are high, the ratio of the signal inputs is to all intents and purposes equal to the inverse ratio of the gains, the integer 1 being of no moment. Any variation in the relative gains of these tubes, therefore, causes the potential of the jucture 38 to vary by an amount sufficient to compensate for the difference in gains and the outputs of the amplifier and phase inverter are maintained equal.

If it is desired to obtain a mathematically accurate balance the resistor 36 may be made slightly smaller than the resistance 37. For example, where tubes 16 and 27 comprise the two triode sections of a 6SL7, the resistor 36 may have a value of 430,000 ohms while the resistor 37 may have a value of 470,000 ohms.

The outputs of the amplifier 16 and phase inverter 27, which are maintained of equal amplitude but opposite phase by the network just described, are impressed on the respective inputs of the coupling tubes 23 and 32 in the manner aforesaid. Tubes 23 and 32 are connected to operate in push-pull and have their respective anodes 41 and 42 connected together and to the positive terminal 19 of the voltage supply source through a circuit which includes conductor 39, resistor 43 and conductor 44. The respective cathodes 46 and 47 are each connected to the negative terminal of the voltage supply source through their respective cathode resistors 48 and 49 and the conductor 51, the negative terminal being for example, 100 volts below ground potential as diagrammatically indicated by the connection of an intermediate terminal of the voltage divider 21 to ground. It will be apparent that the resistor 48 is common to the input and output circuits of tube 23 while the resistor 49 is common to the input and output circuits of tube 32. Any signal variations which are impressed on the inputs of these tubes, therefore, cause corresponding variations in potential to appear across resistors 48 and 49 and the coupling tubes 23 and 32 are caused to operate as cathode followers.

The signal variations which appear across the cathode resistors 48 and 49 are respectively impressed on the inputs of a pair of push-pull power tubes 52 and 53 by direct metallic conductors connecting the cathode 46 with the control electrode 54 and the cathode 47 with the control electrode 55.

Power tubes whether beam power tubes or power tubes of other types require a low impedance input to operate satisfactorily, while the resistance coupling in the output circuits of the amplifier 16 and phase inverter 27 are high impedance circuits. The inclusion of the cathode followers 23 and 32 between the output circuits of the amplifier 16 and phase inverter 27 and the input circuits of the power tubes 52 and 53, therefore, permits the required impedance transformation and insures satisfactory distortion free operation.

The use of this cathode follower coupling between the amplifier and phase inverter and the push-pull power amplifiers additionally introduces other advantages as these elements are incorporated in the instant invention. As heretofore described the respective cathodes of the push-pull cathode followers are directly connected to the control electrodes 54 and 55 of the power amplifiers 52 and 53 and the use of coupling condensers is avoided. The input circuits of power amplifiers 52 and 53, therefore, are composed of pure resistance and no reactance is introduced therein.

Consider for example, the action when high sharp peak signals are impressed on the inputs of the amplifier tubes 52 and 53. These signals may be and often are so high in peak value as to drive the grids 54 and 55 sufficiently positive to cause grid current to flow. If coupling condensers are utilized these elements will acquire a charge as a result of such grid current flow which will require some time to be dissipated. In the meantime, however, the charge acquired by such coupling condensers acts as an additional bias on the grids of the power tubes and in effect raises their cutoff level. This will result in signals of only moderate levels being cut off and flattened on their negative swings, thereby introducing an additional amount of distortion.

In the present invention by use of the circuit depicted and described the use of coupling condensers is avoided and consequently the distortional effects produced thereby is also avoided.

The outputs of the push-pull amplifier tubes 52 and 53 are connected to the primary 56 of a push-pull transformer 57 the secondary 58 of which is connected to a load represented by the terminals 59, 59 which may be the voice coil of a loudspeaker or the like.

As a further means of reducing distortion to the lowest possible point and coacting with the other instrumentalities heretofore described, negative feedback is employed. Negative feedback acts to reduce distortion and noise and to stabilize the amplifier roughly in proportion to the amount of feedback employed. Of course, there is also a smaller attendant reduction in gain but this is not a material inconvenience as weighed against the advantages obtained, since proper design and the judicious use of components will produce all the gain that may conceivably be required.

It is highly desirable, therefore, to use relatively large amounts of negative feedback to attain the advantages attendant on such use. Other factors, however, tend to limit the amount of feedback that can be used. Voltage feedback reduces the internal impedance of the amplifier and if a relatively large feedback is used the internal impedance may be reduced to such an extent as to cause mismatch between the load and amplifier. On the other hand current feedback increases the internal impedance of the amplifier and if any great amount thereof is used a mismatch of the opposite nature is produced.

In the present invention this difficulty is solved by using both types of feedback. By such an arrangement a greater amount of feedback is permissible and the two circuits, one acting to increase the amplifier internal impedance and the other acting to decrease it, are so balanced that the internal impedance is nicely matched with the load that is to be imposed on the amplifier.

The voltage feedback circuit consists of the conductor 61 connected between the secondary 58 and the ungrounded side of the load 59 and the cathode of the amplifier 16. Resistors 62 and 63 and condenser 64 are included in this circuit to act as a phase shifting network so that the feedback voltage is in proper phase relation to the input signal offsetting the effect of the reactance of the transformer secondary 58 and the voice coil of the loudspeaker load.

The current feedback circuit consists of the conductor 66 connected between the opposite side of the secondary 58 and the secondary 14 of the input transformer 13. Variations in feedback in accordance with the current flow in the output are obtained by the variations in potential drop produced by this current flowing in resistor 67 connected between the conductor 66 and the grounded side of the load 59.

Aside from permitting the use of a greater amount of feedback the use of the current feedback circuit has the additional advantage of providing improved operation when two or more of the amplifiers of the instant invention are connected in parallel to produce a greater output. When such operation is had, ideal operation would consist of each amplifier sharing an equal portion of the load, since when one amplifier contributes a greater share the output is limited by the overloading of the amplifier contributing the greater share. Circuit elements and particularly thermionic tubes cannot be matched with great exactitude and hence two amplifiers of the same construction may vary in gain and internal impedance which affect the power output.

When, however, current feedback is used the operation of the amplifiers is stabilized and the total power output even when the characteristics of each depart from each other to some extent is still more nearly the maximum power than might be attained if both were identical in all respects.

Figure 2:
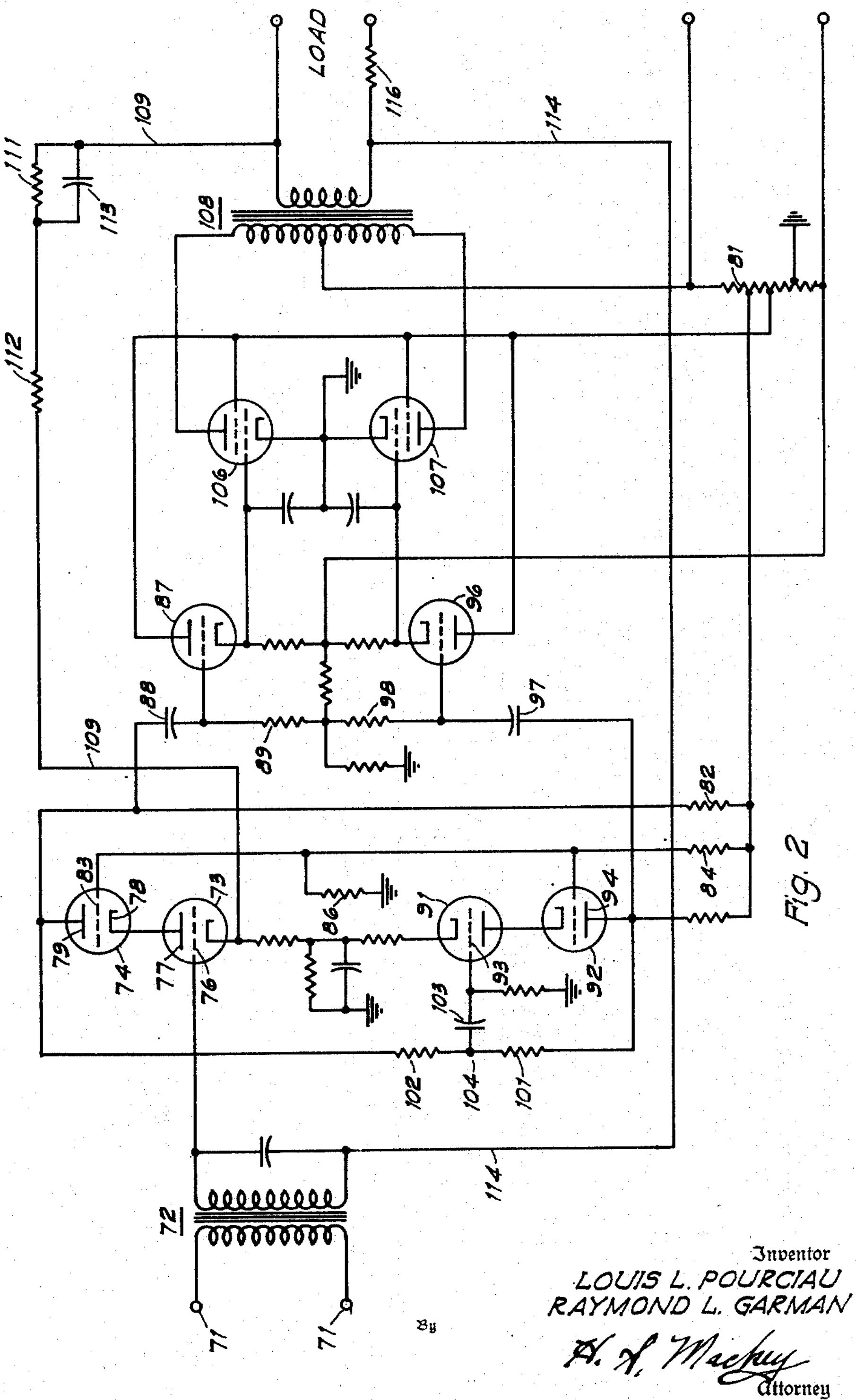
Figure 2 is a schematic diagram of a modified amplifier circuit capable of larger power outputs than the amplifier of Fig. 1.

In Fig. 2 there is disclosed a modified form of amplifier similar in many respects to the amplifier depicted in Fig. 1 but having a somewhat different input circuit yielding a greater degree of amplification.

The signal to be amplified, derived from a preamplifier or other source, is derived from the terminals 71, 71 and is impressed on the first amplifier stage through the medium of a transformer 72.

The first amplifier stage consists of tubes 73 and 74, or if desired two triode sections enclosed in a single envelope, having their anode circuits connected in series.

The input signal is impressed on the control electrode 76 of section 73 and the anode 77 of this section is directly connected to the cathode 78 of the section 74. The anode 79 of section 74 is connected to a positive terminal of the potential supply source 81 through an output resistor 82 and the control electrode 83 has impressed thereon a fixed potential determined by the divider circuit comprising resistors 84 and 86.

A variable signal potential applied to the control electrode 76 of the section 73 will result in a variation of current flow through the section 73 and hence a variation of the potential of the anode 77 and cathode 78 connected thereto. Inasmuch as the potential of the control electrode 83 is fixed by the voltage divider 84 and 86, a variation of the potential of the cathode 78 produces a relative potential change between these elements which constitutes the input for the section 74. These two stacked sections, therefore, act in the manner of a pentode but the amplification is greater and greater input signal variations are permitted without distortional effects.

The output of the first amplifier stage is derived from the anode 79 and is impressed on the input of a coupling tube 87 through a network consisting of a coupling condenser 88 and a resistor 89.

A phase inverter stage is composed of a similar arrangement of stacked tube sections 91 and 92. The input for this phase inverter stage is derived from the anode 79 and is impressed on the control electrode 93 of the section 91. The output of the inverter stage is in turn derived from the anode 94 and impressed on the input of a coupling tube 96 through a coupling network comprising a coupling condenser 97 and resistor 98.

The outputs of the amplifier stage and the phase inverter stage are connected to oppose each other through the series connected resistors 101 and 102 and the input of the phase inverter is connected to the floating junction 104 of these resistors so that regardless of any inadvertent difference in the gain of the amplifier stage and the inverter stage, the outputs thereof are always equal and opposite for the same reasons as more fully described in connection with the circuit of Fig. 1.

Thermionic tubes 87 and 96 comprise push-pull cathode followers coupling the outputs of the amplifier stage and the inverter stage to the inputs of a pair of push-pull power output tubes 106 and 107, the circuits being essentially similar to those described in detail in connection with the amplifier of Fig. 1 and repetition of such description is unnecessary to enable one skilled in the art to understand their principle and mode of operation.

Similarly the push-pull output tubes are connected to the load through a transformer 108 and negative voltage feedback as attained by the circuit consisting of conductor 109, resistors 111 and 112 and condenser 113; and negative current feedback by the circuit comprising conductor 114 and resistor 116.

While for the purposes of clarity the various tube sections depicted in Figs. 1 and 2 have been shown as enclosed in separate envelopes, it will be readily appreciated that a single envelope may enclose several tube sections. For example, in Fig. 1 the amplifier stage and phase inverter stage may comprise a double triode in a single envelope and the same may be true of the stacked amplifier stage and stacked phase inverter stage of Fig. 2 and the cathode follower coupling stages of both figures. Additionally the heaters and heater circuits have been conventionally omitted for simplicity of disclosure.

What is claimed is:

1. A low frequency power amplifier comprising, a first amplifier stage having at least an anode, cathode and control electrode, a signal input circuit connected to said control electrode, a signal output circuit for said first amplifier stage including an impedance connected between said anode and a source of positive potential, a phase inversion stage having at least an anode, cathode and control electrode, an output circuit therefor, including an impedance connected between the anode of said phase inversion stage and said source of positive potential, a pair of ungrounded resistors connected in series between the anode of said amplifier stage and the anode of said phase inversion stage, a signal input circuit connected between the control electrode of said phase inversion stage and the juncture of said pair of resistors, a push-pull coupling circuit comprising a pair of thermionic tube sections having their anodes directly connected to said source of positive potential and their cathodes connected to a source of negative potential by a pair of serially connected resistors common to the respective input and output circuits of said tube sections, a signal circuit connecting the anode of said amplifier stage and the input of one of said tube sections, a signal circuit connecting the anode of said phase inversion stage and the input of the other of said tube sections, a pair of power amplifier tubes connected in push-pull, direct connections from the cathodes of each of said pair of tube sections and the respective control electrodes of said power tubes, an output circuit for said power amplifier tubes, a voltage feedback circuit connected between the power amplifier tube output circuit and the signal input circuit of said first amplifier stage and a current feedback circuit connected between said power amplifier tube output circuit and the signal input circuit of said first amplifier stage.

2. An amplifier in accordance with claim 1 in which said first amplifier stage comprises a pair of thermionic tube sections having their anode cathode paths connected in series and said phase inversion stage comprises a second pair of thermionic tube sections having their anode cathode paths connected in series.

3. In a power amplifier the combination comprising, a first tube section having at least an anode, cathode and control electrode, a signal input circuit connected to said control electrode, a second tube section having at least an anode, cathode and control electrode, the cathode of said second tube section being directly connected to the anode of said first tube section, a third tube section having at least an anode, cathode and control electrode, a signal circuit connected between the anode of said second tube section and the control electrode of said third tube section, a fourth tube section having at least an anode, cathode and control electrode, the cathode of said fourth tube section being directly connected to the anode of said third tube section, a pair of power amplifier tubes connected in push-pull, a signal circuit coupling the output of said second tube section with the input of one of said pair of power amplifier tubes, a signal circuit coupling the output of said fourth tube section with the input of the other of said pair of power amplifier tubes, a voltage feedback circuit connected between the output of said power amplifier tubes and the input of said first tube section and a current feedback circuit connected between the output of said power amplifier tubes and the input of said first tube section.

4. In a power amplifier, an amplifier stage comprising first and second triode sections connected in series across a potential supply source, a signal input circuit connected to the control electrode of said first section, a signal input circuit connected to the anode of said second section, a phase inversion stage comprising third and fourth triode sections connected in series across a potential supply source, an output circuit connected to the anode of said fourth section, circuit means for maintaining the control electrodes of said second and fourth triode sections at fixed potential, a pair of ungrounded series resistors connected in series relationship between the anodes of said second and fourth triode sections, a signal circuit connecting the control grid of said second triode section to the common junction of said series resistors, a pair of push-pull power amplifier tubes, a coupling circuit connecting the input of one of said power amplifier tubes to the output circuit of said amplifier stage and a coupling circuit connecting the input of the other of said power amplifier tubes to the output circuit of said phase inversion stage.

5. A low frequency power amplifier comprising, a thermionic amplifier stage including first and second thermionic tube sections having their anode cathode paths connected in series, a signal input circuit connected to the input of said first thermionic tube section, a phase inversion stage including first and second thermionic tube sections having their anode cathode paths connected in series, circuit means connecting the output of said second amplifier tube section to the input of said first phase inversion tube section, a push-pull coupling circuit including a pair of thermionic tube sections having their anodes directly connected to a source of positive potential and their cathodes connected to a source of negative potential through respective ones of a pair of serially connected resistors common to respective input and output circuits of said last mentioned tube sections, a signal circuit connecting the anode of said second amplifier tube section to the input of one of said coupling circuit tube sections, a second signal circuit connecting the anode of said second phase inversion tube section to the input of the other of said coupling circuit tube sections, a pair of power amplifier tubes connected in push-pull, direct metallic connections between the cathodes of said respective coupling circuit tube sections and respective control electrodes of said power amplifier tubes a transformer coupled to the output of said power amplifier tubes having a secondary connected to a load, a negative voltage feedback circuit and a negative current feedback circuit each being connected between said transformer secondary and the signal input circuit.

6. A low frequency power amplifier comprising, a thermionic amplifier stage including first and second tube sections each having at least an anode, cathode and control electrode said tube sections having their anode cathode paths connected in series, a phase inversion stage including third and fourth tube sections each having at least an anode, cathode and control electrode and having their anode cathode paths connected in series, an ungrounded resistance network interconnecting the anodes of said second and fourth tube sections, a signal circuit connecting an intermediate terminal of said resistance network and the control electrode of said third tube section, a pair of power amplifier tubes connected in push-pull each having input and output circuits, a signal circuit coupling the anode of said second tube section and the input circuit of one of said power amplifier tubes, a second signal circuit coupling the anode of said fourth tube section and the input of the other of said power amplifier tubes, a load circuit coupled to the output circuits of said power amplifier tubes, a voltage feedback circuit connected between said load circuit and the cathode of said first tube section and a current feedback circuit connected between said load circuit and the control electrode of said first tube section.

LOUIS L. POURCIAU.
RAYMOND L. GARMAN.

REFERENCES CITED

The following references are of record in the file of this patent:

UNITED STATES PATENTS

| Number | Name | Date |
|---|---|---|
| 2,240,286 | Cousins | Apr. 29, 1941 |
| 2,273,997 | Rubin | Feb. 24, 1942 |
| 2,281,618 | Riddle, Jr. | May 5, 1942 |
| 2,365,575 | Maxwell | Dec. 19, 1944 |

FOREIGN PATENTS

| Number | Country | Date |
|---|---|---|
| 507,641 | Great Britain | June 19, 1939 |